United States Patent [19]

Stipanuk et al.

[11] Patent Number: 4,714,435
[45] Date of Patent: Dec. 22, 1987

[54] CONNECTION FOR FLEXIBLE APPARATUS

[75] Inventors: John M. Stipanuk, Glen Ellyn; John M. Yun, Oak Brook, both of Ill.

[73] Assignee: Molex Incorporated, Lisle, Ill.

[21] Appl. No.: 23,936

[22] Filed: Mar. 5, 1987

Related U.S. Application Data

[63] Continuation of Ser. No. 798,191, Nov. 14, 1985, abandoned.

[51] Int. Cl.$^4$ .............................................. H01R 9/07
[52] U.S. Cl. .................................... 439/496; 439/326; 439/497; 439/620
[58] Field of Search ............... 339/14 R, 17 F, 143 R, 339/147 R, 176 MF; 361/398, 401; 439/67, 77, 59–62, 326, 495, 496, 497, 620

[56] References Cited

U.S. PATENT DOCUMENTS 3,399,372 8/1968 Uberbacher ...................... 339/14 R
3,482,201 12/1969 Schneck ........................... 339/14 R

OTHER PUBLICATIONS

IBM Bulletin, Hafer, vol. 21, No. 11, p. 4634, 4-1979.

*Primary Examiner*—Neil Abrams
*Attorney, Agent, or Firm*—John W. Cornell; Louis A. Hecht

[57] ABSTRACT

A connection for flexible circuits permits one or more flexible circuits such as flat flexible cables to be connected to a standard and widely used electrical connector such as a printed circuit board edge connector. The connection includes a substantially rigid flexible circuit structure having a carrier of flat planar configuration with opposed surfaces. A flexible circuit is adhesively bonded to at least one surface with conductive traces of the circuit exposed. Electrical connections are made to the traces by inserting the carrier with attached flexible circuit into a connector having a housing supporting a plurality of terminals with contact portions in a linear array engageable with the exposed conductive traces of the flexible circuit.

2 Claims, 13 Drawing Figures

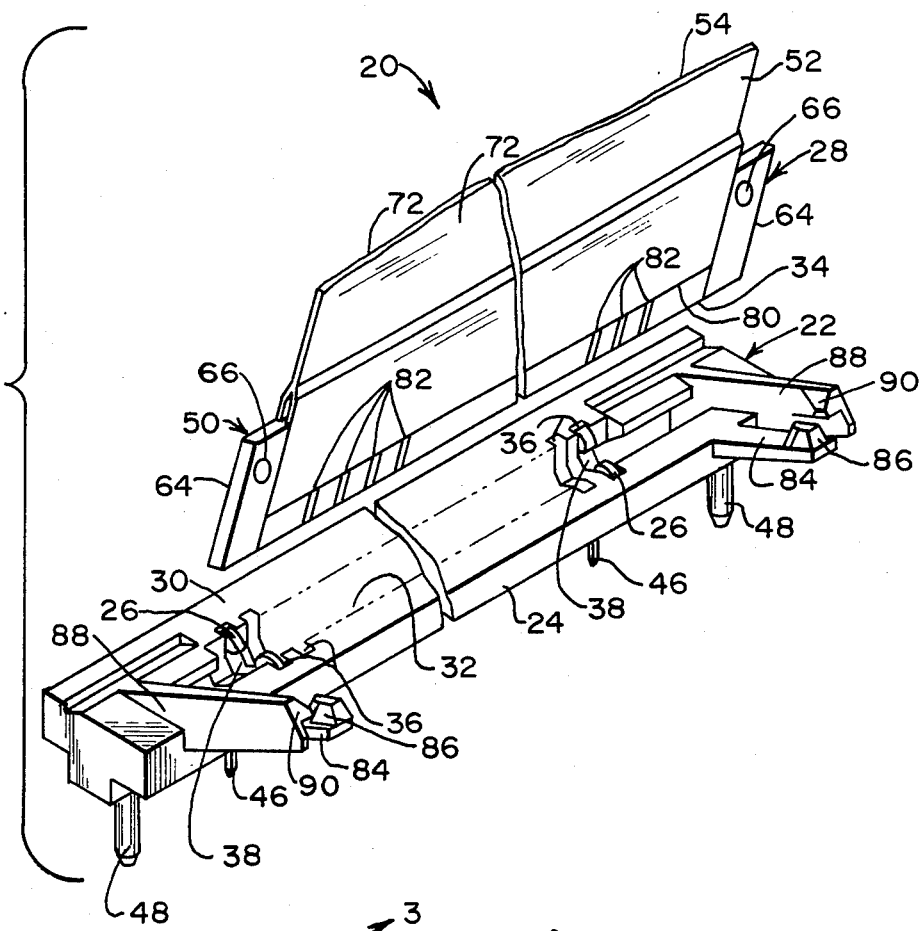
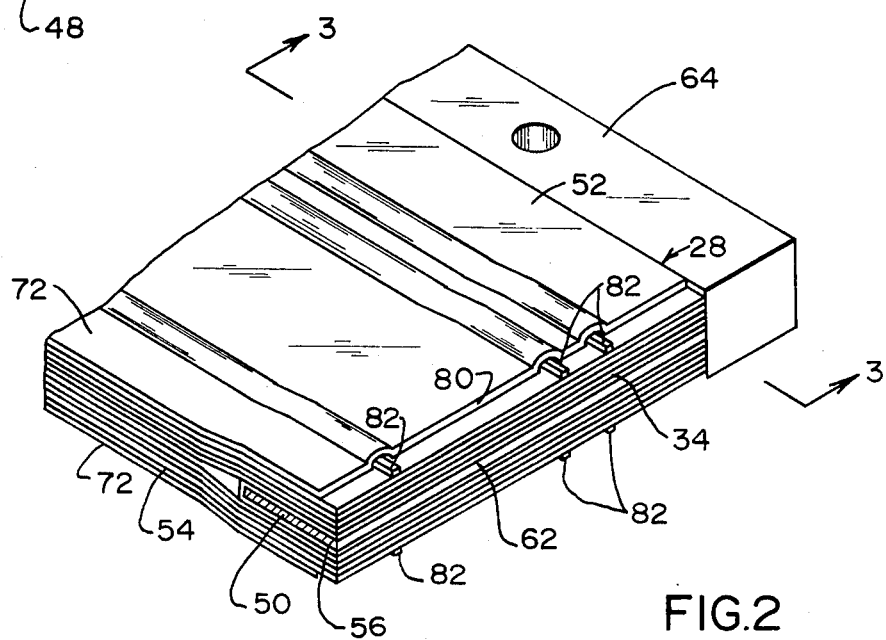

CONNECTION FOR FLEXIBLE APPARATUS

This application is a continuation of application Ser. No. 798,191 filed Nov. 14, 1985 now abandoned.

BACKGROUND OF THE INVENTION

1. Field of the Invention

The present invention relates to an improved structure and electrical connection assembly for making electrical connections to flexible traces of flexible circuits such as flat flexible cables.

2. Description of the Prior Art

A typical flexible circuit includes a layer of flexible, electrically insulating film carrying an array of conductive traces. The array of traces may be covered by another layer of film. One type of flexible circuit is a flat flexible cable (sometimes called flat flex cable or FFC) in the form of an elongated web or strip with a regular array of conductive traces parallel to one another and parallel to the longitudinal direction of the strip.

The lack of rigidity of flexible circuits and flat flexible cables renders them desirable for use in making electrical connections where flexibility or compliance of the circuit or cable is required. However, connectors used in the past for making electrical connections to the conductive traces of flexible circuits or cables have been subject to difficulties including expense, complexity and difficulty in assembly and use.

U.S. Pat. No. 3,158,421 discloses an electrical connector capable of receiving the edge of a printed circuit board with a flexible circuit frictionally held over the board edge. Openings formed in the flexible circuit permit terminals of the connector to contact conductive areas on the printed circuit board. Conductors of the flexible circuit engage conductive areas of the printed circuit board but are not engaged by terminals of the electrical connector.

U.S. Pat. No. 3,843,951 discloses a connection of an electrical component such as a printed circuit board to a flexible circuit in which the board or other component is forced along with the flexible circuit into a recess in a support member. The support member serves a mechanical and not an electrical function and contact is made between conductors of the flexible circuit and conductors of the printed circuit board or other component.

U.S. Pat. No. 3,923,364 discloses a flexible conductor cable and an assembly for making electrical connections to conductors and to a ground shield layer of the cable. The cable is forced over a mandrel by an electrical connector. The connector includes terminals making electrical contact with the conductors or ground shield layer of the flexible cable.

U.S. Pat. Nos. 3,848,952 and 4,136,917 disclose zero or low insertion force electrical connectors for making edge connections with printed circuit boards. Connectors of this general class are widely used, but have not heretofore been capable of effectively making electrical connections with flexible circuits.

SUMMARY OF THE INVENTION

Among the objects of the present invention are to provide an improved electrical connection assembly in which electrical connections are made to conductive traces of a flexible circuit or cable; to provide an improved electrical connection in which a flexible circuit may be easily and repeatedly connected by plugging into a printed circuit board edge connector; to provide an improved structure including one or more flexible circuits or cables capable of being connected to an electrical connector in the same manner as a printed circuit board; to provide a plug-in connectable flexible circuit structure incorporating electrical components; and to provide connections for flexible circuits overcoming disadvantages encountered with those used in the past.

In brief, these and other objects of the present invention are achieved by providing a flexible circuit structure including a carrier to which a flexible circuit is adhesively bonded. The carrier is a functionally rigid, flat, planar body to which an inner face of the flexible circuit is attached. The outer face of the flexible circuit includes an exposed array of conductive regions, and the structure may be plugged into a standard electrical connector such as a printed circuit board edge connector to conveniently and repetitively make electrical connections to the conductive regions of the flexible circuit.

An electrical connection assembly in accordance with the present invention includes a connector having support means in which a plurality of terminals are supported. The terminals include first contact portions in a linear array and second contact portions for connection to another circuit means, for example, a printed circuit board. A flexible circuit is attached to a flat, planar surface of a substantially rigid carrier member, with conductive regions of the flexible circuit being exposed and facing away from the flat, planar surface. The carrier member with the flexible circuit attached thereto is inserted into the connector with the flat, planar surface generally parallel to the linear array of first contacts and at least some of the conductive regions are in contact with the first contact portions of the terminals.

BRIEF DESCRIPTION OF THE DRAWINGS

The present invention together with the above and other objects and advantages may be best understood from the following detailed description of the preferred embodiments of the invention illustrated in the drawings, wherein:

FIG. 1 is a perspective view of an electrical connection assembly including an electrical connector and a flexible circuit structure in accordance with the present invention;

FIG. 2 is a fragmentary perspective view, partly in section, of the flexible circuit structure of FIG. 1;

DETAILED DESCRIPTION OF THE PREFERRED EMBODIMENTS

Figure 3:
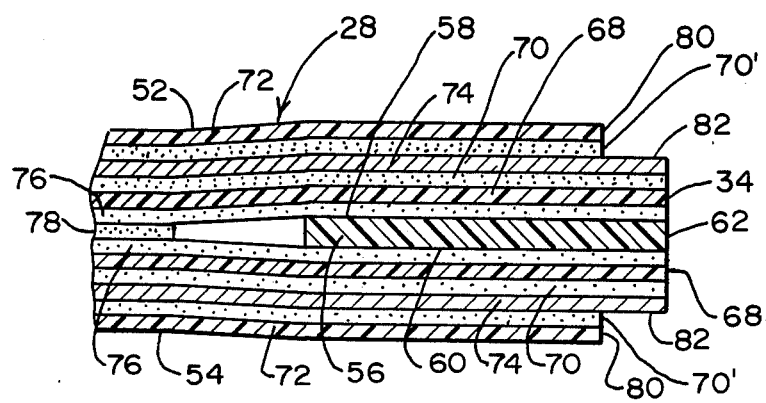
FIG. 3 is a sectional view on an enlarged scale taken along the line 3—3 of FIG. 2.

The present invention provides an electrical connection in which a structure including a flexible circuit such as a flat flexible cable can simply be plugged into a standard printed circuit board edge connector. This provides substantial advantages because such edge connectors are widely used and readily available at reasonable cost. Since the same connector can accept a circuit board or a flexible circuit, the advantages of a modular system are achieved. In addition, the electrical connection in accordance with the invention can be connected and disconnected many times without damage to the flexible circuit or cable. The electrical connection can include more than one flexible circuit and can accommodate a connection including a ground plane. Circuit components such as filters or other components can be incorporated into the electrical connection.

Referring now to the drawings, FIG. 1 shows an electrical connection assembly designated as a whole by the reference numeral 20 and constructed in accordance with principles of the present invention. Assembly 20 includes an electrical connector 22 having a housing 24 in which are supported an array of electrical terminals 26. In accordance with an important feature of the invention, a flexible circuit structure generally designated as 28 is plug-in connectable to the connector 22.

Features of the present invention are applicable to the electrical connection of flexible circuits to many specific types of electrical connectors. Preferably, connection is made to a printed circuit board edge connector of the type commonly used to make electrical connections to a linear array of conductive pads or regions along an edge of a printed circuit board. Because of the possibility that a flexible circuit or cable may be fragile, it is preferred that the connection include an edge connector having little or no insertion force requirements.

Referring more specifically to the connector 22 illustrated in FIG. 1, housing 24 includes an elongated body portion 30 defining an elongated socket or recess 32 into which a leading edge or end 34 of flexible circuit structure 28 may be received. Socket 32 communicates with numerous recesses 36, each or selected ones of which receive a terminal 26. Each terminal 26 includes a first, spring contact portion 38 (FIGS. 1, 8 and 9) of a rounded, continuously curved, generally C-shape with opposed free ends 40 and 42 (FIG. 9). A leg portion 44 mounted in the housing 24 extends from the spring contact portion 38 and rockably supports the spring contact portion 38 in socket 32 with free end portions 40 and 42 along parallel lines. A second, pin contact portion 46 (FIG. 1) extends externally of housing 24, although it should be understood that the second contact portion may be of other selected configurations if desired.

In the illustrated arrangement, connector 22 is intended to be mounted upon a printed circuit board. Housing 24 includes projections 48 received within locating holes in a printed circuit board (not shown) for positioning and mounting the connector 22. Pin contact portions 46 are intended to extend through holes in the printed circuit board and be wave or flow soldered to establish electrical connections between the pin portions 46 and conductive regions on the printed circuit board.

In many respects, portions of the connector 22 including socket 32, recesses 36 and terminals 26 are similar to those of the low insertion force electrical connector disclosed in commonly owned U.S. Pat. No. 4,575,172 which is incorporated herein by reference and may be consulted for further disclosure of components of connector 22 beyond those required for an understanding of the present invention.

Figure 4:
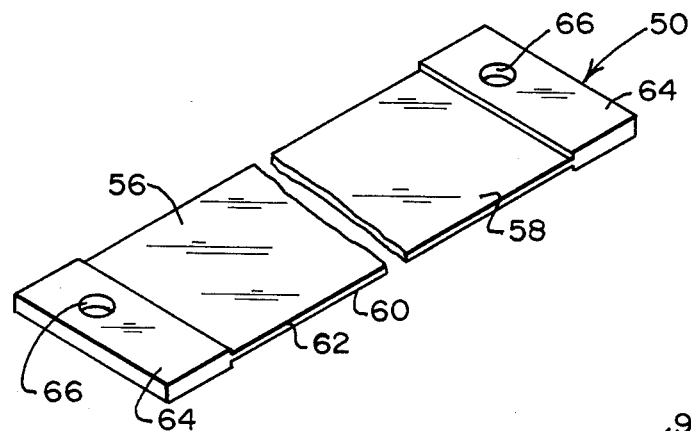
FIG. 4 is a fragmentary perspective view of the carrier of the flexible circuit structure of FIG. 1.

Flexible circuit structure 28 is illustrated in more detail in FIGS. 2, 3 and 4. It includes a carrier 50 with which a pair of flexible circuits 52 and 54 are assembled to form a functionally rigid plug-in connectable assembly insertable into socket 32 of connector 22. As best illustrated in FIG. 4, carrier 50 includes an elongated central segment 56 having two flat, planar opposed surfaces 58 and 60 and having a forward edge 62. Opposite ends of the carrier include enlarged segments 64 thicker than the central portion 56. Each end segment is provided with a positioning hole 66. Carrier 50 may be economically formed of a suitable molded plastic material such as polyester having desired strength and rigidity.

Flexible circuits 52 and 54 may be identical or similar to one another in construction. In the illustrated arrangement, each circuit comprises a flat flexible cable in the form of an elongated strip or web, of which only an end segment is illustrated. Each flexible circuit 52 and 54 includes an inner layer or lamination 68 of an electrically insulating, flexible, strong material such as polyester film. A layer 70 of adhesive covers the outer surface of film layer 68 and bonds layer 68 to an outer film layer 72 which may be identical or similar to inner layer 68. A number of conductive traces or conductors or conductive regions 74 are sandwiched between inner and outer film layers 68 and 72. Traces 74 may be formed of a suitable conductive and somewhat flexible material such as copper and, in the illustrated arrangement, extend parallel to one another and parallel to the longitudinal direction of the cable. Thus traces 74 extend transverse to the major longitudinal direction of carrier 50. Conductors or traces 74 may be fabricated and secured within cables 52 and 54 in various ways. In the illustrated cables, they are bonded in place by adhesive layer 70.

As illustrated in FIGS. 2 and 3, the inner film layers 68 of circuits 52 and 54 are attached to the flat, planar surfaces 58 and 60 of carrier 50. This attachment is made by means of adhesive layers 76 interposed between carrier surfaces 58 and 60 and the film layers 68 of circuits 52 and 54. The portion of the circuits 52 and 54 spaced away from carrier 50 in the direction opposite the leading edge 62 are adhesively bonded together by an additional layer 78 of adhesive. It should be understood that in this region, the adhesive layers 76 may directly contact one another if preferred.

Near the leading edge 34 of the flexible circuit structure 28 the outer film layers 72 of circuits 52 and 54 are removed or cut-away at 80 as seen in FIG. 3 to uncover exposed end segments 82 of the conductive traces 74. The entire width of layers 72 may be removed (FIG. 2)

or only selected traces 74 may be exposed if desired by cutting away only selected regions of layers 72. In either case, the end segments 82 constitute a linear array of conductive regions facing in the direction opposed to the carrier 50. Each linear array of segments 82 is parallel to and adjacent the leading edge 34 of the flexible circuit structure 28. As seen in FIGS. 2 and 3, circuits or cables 52 and 54 end at the plane of the forward edge 62 of carrier 50, and these ends as well as edge 62 define the leading end 34 of the circuit structure 28.

The interconnection of the flexible circuit structure 28 to the electrical connector 22 is indicated in FIG. 1. The strength and rigidity of the carrier 50 enables the flexible circuit structure 28 to be easily handled and plugged into socket 32 of connector 22. Leading edge 34 is inserted into the socket 32 with the flexible circuit structure 28 oriented so that the exposed conductive regions 82 enter the spring contact portions 38 of terminals 26 with little or no insertion force. When the leading edge 34 is seated in socket 32, the flexible circuit structure 28 is then pivoted (to the right in the orientation shown in FIG. 1) toward a fully seated, home position.

Pivoting movement of flexible circuit structure 28 with respect to connector 22 is limited by a pair of support arms 84 of connector housing 24. Each arm 84 includes a locating projection 86. When the flexible circuit structure 28 is fully inserted and pivoted to the home position, projections 86 engage the positioning holes 66 of carrier 50. Transversely flexible latch arms 88 have camming and latching projections 90 snapping over the carrier ends 64 to releaseably retain the structure 28 in the home position.

In the home position, a reliable and compliant spring contact is made between the free ends 40 and 42 of the spring contact portions 38 and the corresponding exposed end segments 82 of the conductive traces 74. The flexible circuit structure 28 can readily be disconnected from electrical connector 22 by flexing latch arms 88, and the conductive traces 70 are not damaged either by insertion or disconnection. Consequently, the electrical connection 20 of the present invention is well suited for use where electrical circuits are repetitively connected and disconnected to other electrical components such as a printed circuit board with which the electrical connector 22 may be associated.

Since one important advantage of the present invention is that electrical connection may be made with widely used printed circuit board edge connectors, it is preferred that the dimensions of the flexible circuit structure 28 be similar to the dimensions of an edge portion of a standard printed circuit board. For example, one standard printed circuit board with which edge connectors are widely used has a thickness of 0.050 inch. Thus it is preferred that the central portion 56 of carrier 50 have a thickness such that when assembled with the flexible circuits 52 and 54, the finished width or thickness is about 0.050 inch. In one embodiment of the invention, the thickness of portion 56 is 0.037 inch, the thickness of each adhesive layer 76 is 0.0015 inch, the thickness of each inner film layer 68 is 0.002 inch, the thickness of adhesive layers 70 is 0.003 inch, the thickness of each conductive trace 74 is 0.0014 inch, and the thickness of outer film layer 72 is 0.002 inch.

End segments 64 are approximately equal in thickness to the total thickness of central section 56 plus the thicknesses of circuits or cables 52 and 54 to provide a trim, uniform configuration. In a preferred embodiment, segments 64 are 0.050 inch thick. The foregoing dimensions, while not intended to limit the present invention as defined in the claims set forth below, permit the flexible circuit structure 28 to be readily connected by plugging in to a standard printed circuit board edge connector.

It is not necessary in accordance with the present invention that the flexible circuit structure 28 include two flexible circuits 52 and 54. If desired, a single flexible circuit may be associated with a selected one of the surfaces 58 and 60. In this case, it may be desired that the carrier 50 be correspondingly thicker to provide the proper finished dimension of the flexible circuit structure for plugging into the electrical connector 22 or other electrical connector.

Alternative embodiments of the invention are shown in FIGS. 5-13 of the drawings as examples of the wide range of application of features of the present invention. In many respects these other embodiments are similar to the flexible circuit structure 28 or to one another and only those aspects which are different are described in detail. The reference numbers applicable to the embodiment described above and shown in FIGS. 1-4 are used for corresponding structures in FIGS. 5-13 without repeated description. In each embodiment, the flexible circuit structure is plug-in connectable to connector 22 in the same way as structure 28.

Figure 5:
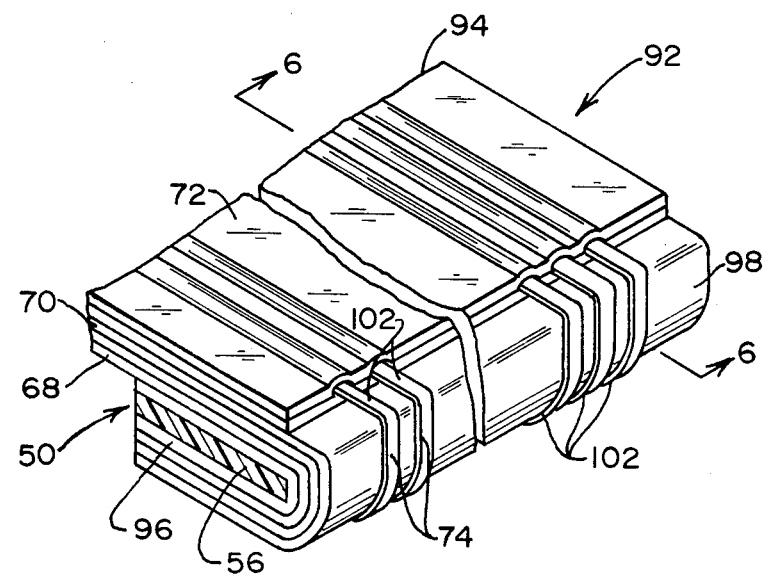
FIG. 5 is a fragmentary perspective view, partly in section, of an alternative embodiment of a flexible circuit structure in accordance with the invention.
Figure 6:
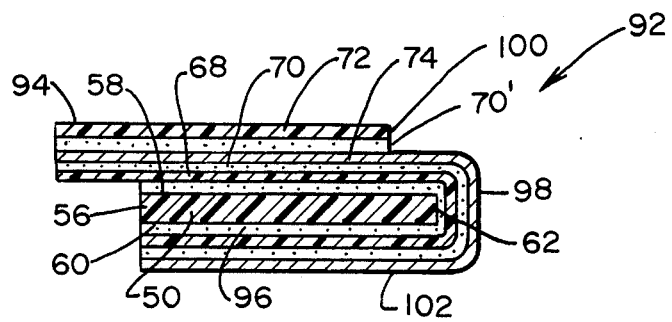
FIG. 6 is a sectional view taken along the line 6—6 of FIG. 5.

FIGS. 5 and 6 illustrate a flexible circuit structure 92 constituting an alternative embodiment of the present invention. Structure 92 includes a single flexible circuit or flat flexible cable 94 similar in construction to circuits or cables 52 and 54. Structure 92 includes a carrier 50, and the flexible circuit 94 is wrapped around the central portion 56 of the carrier. An adhesive layer 96 bonds the inner film layer 68 of structure 92 to the flat, planar surfaces 58 and 60 of carrier 50 and to the forward edge 62. Flexible circuit structure 92 includes a leading edge 98 defined by circuit or cable 94 and spaced forward of edge 62 of carrier 50.

A segment of outer layer 72 is removed from the end segment of the circuit 94 as indicated at 100 to expose portions 102 of conductive traces 74 opposed to both surface 58 and surface 60 of carrier 50. When flexible circuit structure 92 is mated by plugging into the electrical connector 22, each terminal 26 makes two redundant contacts with each exposed trace 74 rather than single contacts with two different traces 74 as is the case with flexible circuit structure 28 described above.

Figure 7:
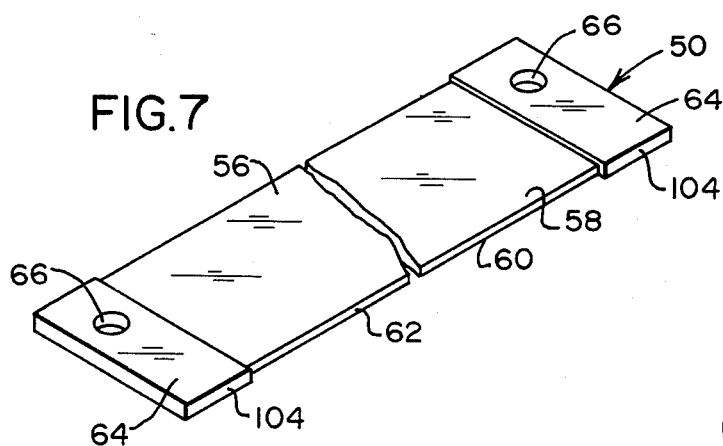
FIG. 7 is a perspective view of the carrier for the flexible circuit structure of FIG. 5.

Carrier 50 for the flexible circuit structure 92 is illustrated in FIG. 7. End portions 64 extend beyond the forward edge 62 as indicated at 104. Projecting parts 104 are approximately flush with the circuit or cable 94 at the leading edge 98.

Figure 8:
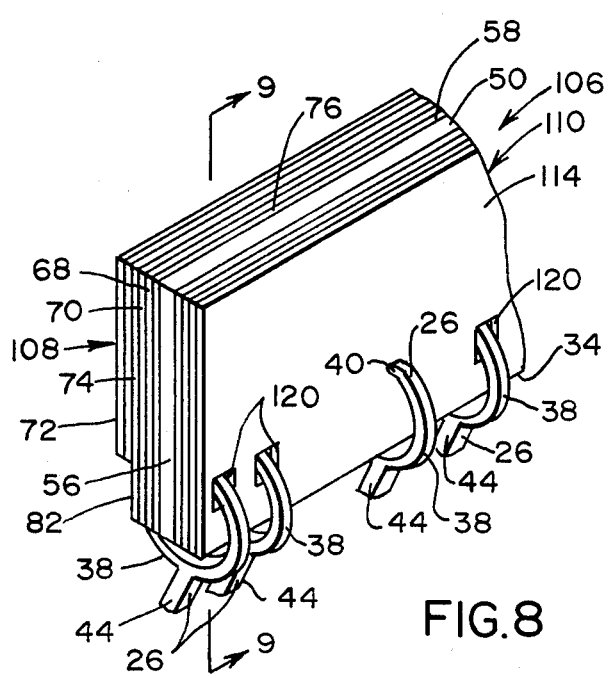
FIG. 8 is a fragmentary perspective view illustrating another embodiment of a flexible circuit structure and further illustrating terminals of an electrical connector to which the structure is connected.
Figure 9:
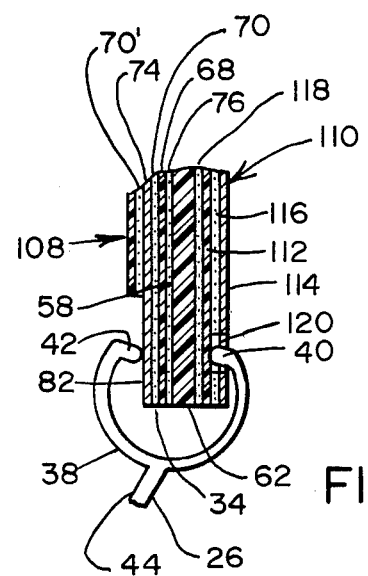
FIG. 9 is a sectional view taken along the line 9—9 of FIG. 8.

FIGS. 8 and 9 illustrate a flexible circuit structure 106 comprising another alternative embodiment of the present invention. Carrier 50 or at least surface 60 of central section 56 may be conveniently formed or covered entirely or in part with an electrically conductive material such as a suitable conductive metal. In use, carrier 50 may then be connected to ground to provide a convenient grounding point for a flexible circuit arrangement including a ground plane. In addition, this structure can conveniently control the discharge of any static electrical charges carried by the flexible circuit structure. However, this conductive covering or composition of carrier 50 is not essential for practice of the present invention.

Flexible circuit structure 106 includes one flexible circuit or cable 108 which may be identical to circuit 52 or 54. Inner film layer 68 is bonded to surface 58 of the central section 56 of carrier 50 by adhesive layer 76. An end segment of outer film layer 72 is cut away at 80 to expose a linear array of exposed end segments 82 of conductive traces 74.

Bonded to the opposite surface 60 of the central portion 56 of carrier 50 is a flexible ground plane circuit 110 including an inner film layer 112 to which a continuous conductive ground plane layer 114 such as metal foil is bonded by an adhesive layer 116. Inner adhesive layer 118 bonds film layer 112 to surface 60. In the region spaced from flexible circuit structure 106, adhesive layers 76 and 118 may be bonded together to form a single flexible circuit or cable including the conductive traces 74 juxtaposed with the ground plane layer 114.

One face of flexible circuit structure 106 constitutes the exposed conductive ground plane layer 110. The opposite face includes a linear array of exposed conductive regions 82 of conductive traces 74. As illustrated in FIGS. 8 and 9, certain portions of the ground plane circuit 110 can be removed to form openings or recesses 120 and other regions may be left intact. Selected recesses 120 may extend only through layer 114 as illustrated in FIG. 9 and one or more other recesses 120 may extend entirely through the ground plane circuit 110 to conductive surface 60.

When flexible circuit structure 106 is connected by plugging into connector 20, selected ones of terminals 26 may make connections to ground plane layer 114 (see FIG. 8). Other terminals 26 may engage cutaway portions 120 of the ground plane layer, and these may engage the surface 60 of carrier 50 or film layer 112 depending on the depth of cutaway portions 120. Each terminal 26 may also selectively engage an exposed region 82 of a conductive trace 74 or may engage a region or void where no conductive trace 74 is present or may engage outer film layer 72 in a region where this layer is not cut away. Programming of the connector may be provided in this manner, wherein ground plane layer 114 and the conductive surface 60 of carrier 50 may be connected to ground and other nongrounded connections may be made to some or all of the conductive traces 74.

In one specific example, two conductive traces 74 are connected to electrical ground at a location remote from the flexible circuit structure 106. Structure 106 is plugged into connector 22. Free end 42 of one terminal 26 engages a grounded trace 74 while the other free end 40 of that terminal engages and grounds the ground plane layer 114. Free end 42 of another terminal 26 engages a grounded trace 74 and the other free end 40 of that terminal extends through a cutaway region 120 to engage and ground surface 60 of carrier 50. Selected signal carrying traces 74 engage terminals 26 having free ends 40 contacting inner layer 112 through recesses 120 as shown in FIG. 9. Additional traces 74 may be grounded by terminals 26 having free ends 40 in contact with layer 114 or with surface 60.

Figure 10:
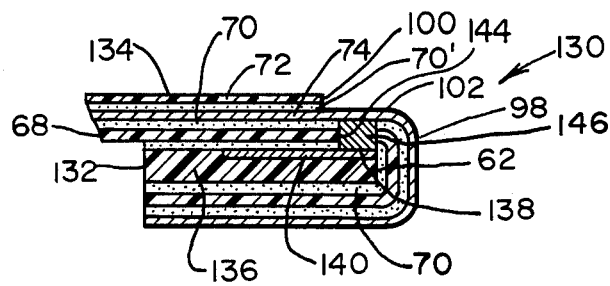
FIG. 10 is a sectional view of another alternative embodiment of a flexible circuit structure in accordance with the invention.
Figure 11:
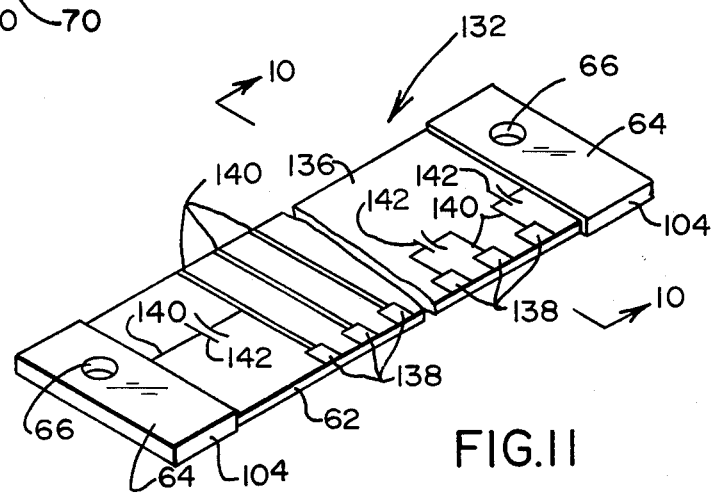
FIG. 11 is a fragmentary perspective view of the carrier of the flexible circuit structure of FIG. 10.

FIGS. 10 and 11 illustrate a flexible circuit structure 130 comprising another alternative embodiment of the invention. Flexible circuit structure 130 includes a carrier 132 assembled together with a flexible circuit 134. Circuit 134 may be similar to circuit 94 of FIG. 6 and is similarly mounted and oriented with respect to its carrier.

Carrier 132 includes a flat, planar central portion 136 formed of an electrically insulating material such as polyester or the like, supporting electrical circuitry which may be applied by thin film or copper etching techniques or the like. Alternatively, circuitry or circuit components may be embedded within the body of the carrier 132. A linear array of pads 138 are disposed near forward edge 62 of the carrier, and conductive paths 140 extend from the pads 138. Electrical components 142 are formed integrally with the carrier segment 144 as by electrical deposition or etching techniques or by encapsulation or the like. In the illustrated arrangement, the components 142 comprise capacitors, but it should be understood that other circuit components are contemplated as well. Carrier end segments 64 may be conveniently formed entirely or in part of an electrically conductive material, and may be connected to ground. This feature, when provided, allows capacitor components 142 to be connected (by conductive paths 140) between pads 138 and/or from pads 138 to grounded end segments 64.

As seen in FIG. 10, certain selected regions of the inner layer 68 and adhesive layer 70 of circuit 134 are cut away as indicated at 144. These cutaway regions 144 are aligned with selected pads 138 on central portion 136 of carrier 132. Inner film layer 68 is adhesively bonded to the surfaces of carrier 132 by a layer of adhesive 146. Selective regions of adhesive layer 146 are electrically conductive and fill the cut away regions 144 to establish circuit paths between pads 138 of carrier 132 and selected ones of the conductive traces 74 aligned with the cutaway regions 144. The adhesive layer 146 may, for example, be an epoxy adhesive material in which conductive particles are present at only selected regions. Alternatively, additional adhesive material or other convenient conductive media may be injected into cutaway regions 144 after the flexible circuit is applied to carrier 132. This would allow convenient visual inspection of the registration of regions 144 and pads 138. In either event, when circuit structure 130 is plugged into a connector 22, terminals 26 contact exposed regions 102 of conductive traces 74 and components 142 integral within the carrier perform a capacitive coupling or bypass filtering function without the necessity for external circuitry.

Figure 12:
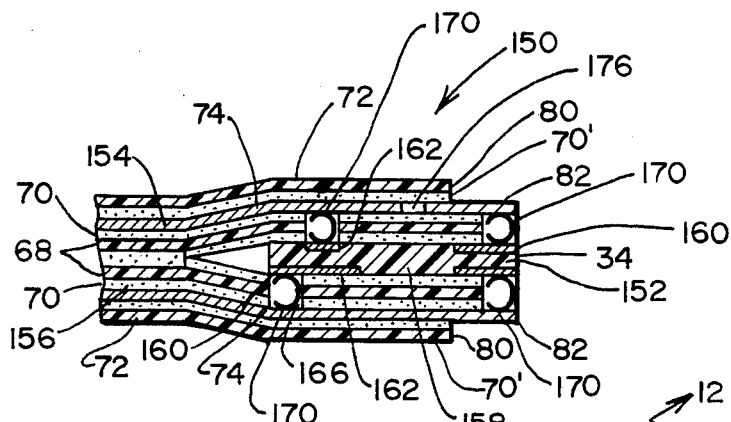
FIG. 12 is a sectional view of another embodiment of a flexible circuit structure in accordance with the invention.
Figure 13:
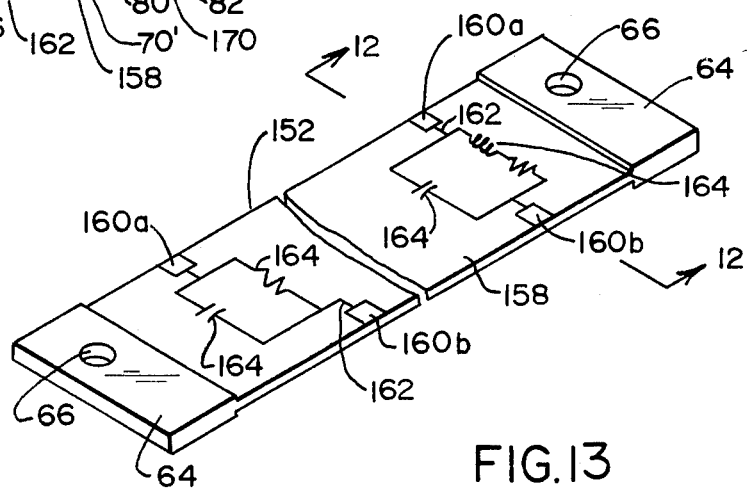
FIG. 13 is a fragmentary perspective view of the carrier of the flexible circuit structure of FIG. 12.

FIGS. 12 and 13 illustrate a flexible circuit structure 150 comprising another embodiment of the present invention. Structure 150 includes a carrier 152 assembled with two flexible circuits 154 and 156. Flexible circuits 154 and 156 may be similar to circuits 52 and 54 and are mounted and oriented to carrier 152 in a similar manner.

Carrier 152 includes a central portion which may be generally similar in construction to portion 136 of carrier 132. Conductive pads 160, conductive paths 162 and electrical components 164 are incorporated on both surfaces of portion 136. In the illustrated arrangement, components 164 comprise different types of circuit devices such as resistors, capacitors and inductances arranged as filters. It should be understood that other types and arrangements of components could be used, including active circuit devices or passive circuit devices. The components, pads and paths can be formed by thick film, copper etched or can be embedded or encapsulated within the central region 158 of the carrier 152.

Electrical circuits are extended at selected locations at both sides of carrier 152 between pads 160 and selected ones of the conductive traces 74. Portions of the inner film layers 68 and adhesive layer 70 are cut away as indicated at 166 where conductive paths are desired. Layers of adhesive 168 bond the circuits 154 and 156 to the opposite surfaces of the carrier 152. Metal spring contacts 170 are received in cut away portions 166 to establish circuit paths from selected conductive traces 74 of circuits 154 and 156 through circuit paths 162 to components 164. In this manner, an electrical filtering function or other electrical or electronic functions can be carried out by circuitry incorporated into the carrier 152 without the necessity for external circuitry. To connect components 164 in electrical series with a trace 74, a portion 176 of trace 74, located between portions 166, is removed. The electrical signal travels down trace 74 to upstream pad 160a, through components 164 to down stream pad 160b. The signal then appears at exposed conductive region 82.

The components 164 of one carrier surface can be electrically connected to the components of the opposing carrier surface. This is true also of the embodiment shown in FIG. 11, wherein capacitors 142 of opposing surfaces can be electrically connected together.

Those skilled in the art of flexible cable or circuit manufacture will appreciate that the specific arrangement of the flexible circuit layers described herein, can be modified and still fall within the scope of the present invention. For example, the conductive traces may be integrally formed with a film layer by doping or loading selected portions of a dielectric layer with conductive particles. Also the conductive traces can be painted directly onto a dielectric film, or they can comprise paths of conductive adhesive deposited directly on a dielectric film without need of an insulative adhesive layer.

We claim:

1. In an edge card arrangement for electrically connecting conductors of a flat flexible circuit member to a second circuit member including
an edge card connector connected to said second circuit member including an elongated dielectric housing with an edge card socket defined therein and a plurality of terminals having one end adapted to electrically mate with the second circuit member and another end adapted to electrically mate with circuits in said flexible circuit member, and
a rigidized flexible circuit assembly adapted to be received in said edge card socket including a rigid carrier, a flexible circuit member including a first insulative layer and a plurality of exposed conductors disposed thereon, the flexible circuit member being bonded on said carrier so that the first insulative layer is disposed adjacent a carrier surface and the exposed conductors face away from the carrier, wherein the improvement comprises:
an in-line filtered interconnect including:
said carrier including a filter circuit having spaced apart first and second contact pads disposed on a major surface thereof;
at least one of said flexible circuit conductors overlying and aligned with said first and second contact pads and a portion of said conductor extending between said first and second contact pads being discontinuous;
means for electrically connecting said overlying conductor to the first and second contact pads; and
at least one of the terminals of the connector electrically engaged to the conductor,
whereby a signal travelling along the conductor is transmitted through electrical connecting means to said first contact pad, through the filter circuit to said second contact pad, through connecting means and emerges at the exposed conductor for engagement by the terminal.

2. The filtered interconnect arrangement of claim 1 further including a grounded interconnect including:
grounding means including a ground plane in said rigidized assembly and at least one of said terminals connected to said ground plane.

* * * * *